United States Patent
Ago et al.

(10) Patent No.: US 6,310,524 B1
(45) Date of Patent: Oct. 30, 2001

(54) EDGE REFLECTION TYPE LONGITUDINALLY COUPLED SAW RESONATOR FILTER

(75) Inventors: Junya Ago, Nagaokakyo; Michio Kadota; Hideya Horiuchi, both of Kyoto, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/496,801

(22) Filed: Feb. 2, 2000

(30) Foreign Application Priority Data

Feb. 16, 1999 (JP) .................................................. 11-037165

(51) Int. Cl.⁷ ................................. H03H 9/64; H03H 9/72
(52) U.S. Cl. ......................... 333/133; 333/193; 333/194; 310/313 B
(58) Field of Search ........................... 333/133, 193–196; 310/313 R, 313 B, 313 C

(56) References Cited

U.S. PATENT DOCUMENTS

| | | | |
|---|---|---|---|
| 4,204,178 | * 5/1980 | Mitchell | 333/194 |
| 5,760,664 | 6/1998 | Allen | 333/194 |
| 5,986,523 | * 11/1999 | Morozumi et al. | 333/194 |
| 6,150,900 | * 11/2000 | Kadota et al. | 333/133 |

FOREIGN PATENT DOCUMENTS

| | | | |
|---|---|---|---|
| 0 762 643 | * 3/1997 | (EP) . | |
| 0854571 | 7/1998 | (EP) . | |
| 63-67809 | * 3/1988 | (JP) | 333/193 |
| 7-321598 | * 12/1995 | (JP) . | |
| 9-294049 | 11/1997 | (JP) . | |
| 11-150442 | * 6/1999 | (JP) . | |

* cited by examiner

Primary Examiner—Robert Pascal
Assistant Examiner—Barbara Summons
(74) Attorney, Agent, or Firm—Keating & Bennett, LLP

(57) ABSTRACT

An edge reflection type longitudinally coupled SAW resonator filter includes a surface acoustic wave substrate having a first end surface and a second end surface which are arranged at opposite ends of the substrate. A plurality of edge reflection, longitudinally coupled resonator filter units are arranged on the surface acoustic wave substrate such that a surface acoustic wave is reflected between the first end surface and the second end surface of the surface acoustic wave substrate. A connecting conductive portion is arranged to electrically connect the plurality of the longitudinally coupled resonator filter units. Each of the longitudinally coupled resonator filter units has a plurality of interdigital transducers aligned in a surface acoustic wave propagating direction. The number of pairs of electrode fingers in the plurality of the longitudinally coupled resonator filter units is equal. In addition, a ratio of the numbers of pairs of the electrode fingers between the plurality of the interdigital transducers in at least one of the plurality of the longitudinally coupled resonator filter units is different from ratios of the numbers of pairs of the electrode fingers between the plurality of the interdigital transducers in the other longitudinally coupled resonator filter units.

21 Claims, 6 Drawing Sheets

EDGE REFLECTION TYPE LONGITUDINALLY COUPLED SAW RESONATOR FILTER

BACKGROUND OF THE INVENTION

1. Field of the Invention

The present invention relates to SAW resonator filters used as band filters and other filters, for example, in mobile communications equipment. More specifically, the present invention relates to edge reflection type longitudinally coupled SAW resonator filters, each of which has a multiple-stage structure in which a single surface acoustic wave substrate is used to define a plurality of longitudinally coupled resonator filter units of an edge reflection type.

2. Description of the Related Art

There have been proposed various surface acoustic wave filters as band filters used in mobile communications equipment. Among such surface acoustic wave filters, longitudinally coupled SAW resonator filters using longitudinal-mode couplings have filter characteristics achieved by coupling two kinds of resonant modes including symmetric modes and asymmetric modes generated by interdigital transducers (hereinafter referred to as IDTs).

In SAW resonator filters, oscillations caused by other modes such as higher modes occur outside of a pass band as spurious responses. Such spurious responses appear in a different manner depending on the configurations of IDTs aligned in a surface acoustic wave propagating direction.

When attenuation outside of the pass band is not sufficiently increased in a SAW resonator filter, a method for connecting a plurality of SAW resonator filters in series is used. However, when the configurations of the plurality of the connected SAW resonator filters are exactly the same, frequency characteristics in the SAW resonator filter units are equal. As a result, since the frequency positions where the above-described spurious responses occur are the same, the spurious responses cannot be significantly attenuated.

Thus, in order to solve the above problems, a SAW resonator filter, which is shown in FIG. 6 of the present application, is disclosed in Japanese Unexamined Patent Publication No. 9-294049.

In a SAW resonator filter 51, two SAW resonator filter units 53 and 54 are disposed on a surface acoustic wave substrate 52. In the SAW resonator filter unit 53, two IDTs 55 and 56 are aligned in a surface acoustic wave propagating direction. In addition, reflectors 57 and 58 are disposed in the surface acoustic wave propagating direction on both sides of the region where the IDTs 55 and 56 are disposed.

Similar to the SAW resonator filter unit 53, the SAW resonator filter unit 54 is arranged such that reflectors 61 and 62 are disposed on both sides of the region where IDTs 59 and 60 are disposed.

The IDT 56 and the IDT 58 are electrically connected by a connecting conductive portion 63. However, the number of pairs of electrode fingers of the SAW resonator filter unit 53 is different from that of the SAW resonator filter unit 54.

In other words, in the SAW resonator filter 51, although the two longitudinally coupled SAW resonator filter units 53 and 54 are connected in series, the numbers of pairs of the electrode fingers of the IDTs of the SAW resonator filter units 53 and 54 are different. As a result, in this structure, the frequency position of a spurious response outside of the band exhibited in the frequency characteristics of the SAW resonator filter unit 53 is different from that of a spurious response outside of the band exhibited in the frequency characteristics of the SAW resonator filter unit 54. Therefore, it is possible to reduce the magnitude of a spurious response in the frequency characteristics of the overall SAW resonator filter 51.

The above-described SAW resonator filter 51, which is disclosed in Japanese Unexamined Patent Publication No. 9-294049, utilizes a Rayleigh wave as one of the surface acoustic waves. Recently, an edge reflection type surface acoustic wave device utilizing an SH-type surface acoustic wave such as a BGS (Bleustein-Gulyaev-Shimizu) wave or a Love wave, as alternatives to the Rayleigh wave, have been studied and developed. In other words, in the edge reflection type surface acoustic wave equipment, reduction in the size of the equipment can be achieved, since it is not necessary to include reflectors on both sides of IDTs.

Accordingly, when a SAW resonator filter defined by connecting the above-described two SAW resonator filter units in series is disposed in the edge reflection type surface-acoustic-wave equipment, a compact SAW resonator filter can be obtained.

However, it is significantly difficult to produce a plurality of edge reflection type SAW resonator filter units by using a single surface acoustic wave substrate and make the numbers of pairs of electrode fingers of IDTs of the SAW resonator filter units different, as described in Japanese Unexamined Patent Publication No. 9-294049. In other words, although it is necessary to form an end surface for reflecting a surface acoustic wave on both sides of IDTs in the edge reflection type SAW resonator, when the numbers of pairs of the electrode fingers of the IDTs of the plurality of the SAW resonator filter units are different, the positions of the end surfaces of the SAW resonator filter units are different from each other.

Therefore, with these conventional devices, processing of the surface acoustic wave substrate is very difficult and a precision in forming the end surfaces is reduced. As a result, the filter characteristics are greatly deteriorated.

SUMMARY OF THE INVENTION

To overcome the problems described above, preferred embodiments of the present invention provide an edge reflection type longitudinally coupled SAW resonator filter in which a spurious response outside of a pass band is effectively suppressed and minimized without losing an advantage in an edge reflection type SAW resonator filter such as easy reduction in the size thereof, so that excellent filter characteristics are achieved.

In an edge reflection type longitudinally coupled SAW resonator filter in accordance with a preferred embodiment of the present invention, the plurality of the longitudinally coupled resonator filter units are provided on the single surface acoustic wave substrate. In this case, since the plurality of the longitudinally coupled resonator filter units have equal numbers of pairs of electrode fingers, the distances between the first end surfaces and the second end surfaces where a surface acoustic wave is reflected are equal in the longitudinally coupled resonator filter units. Accordingly, even though the plurality of the longitudinally coupled resonator filter units are provided on the single surface acoustic wave substrate, the first and second end surfaces are easily produced by cutting or other processes and methods.

Furthermore, in at least one of the plurality of the longitudinally coupled resonator filter units, the ratio of the numbers of pairs of the electrode fingers between the plurality of the IDTs is different from the ratios of the numbers of pairs of the electrode fingers between the plurality of the IDTs in the other longitudinally coupled resonator filter units. As a result, spurious responses occurring in the frequency characteristics of the longitudinally coupled resonator filter units are distributed. Therefore, spurious responses are greatly suppressed and minimized. As a result, an edge reflection type longitudinally coupled SAW resonator filter has excellent filter characteristics.

When each of the longitudinally coupled resonator filter units has a first IDT and a second IDT, and in at least one of the longitudinally coupled resonator filter units, the ratio of the numbers of pairs of the electrode fingers between the first IDT and the second IDT is different from the ratios of the numbers of pairs of the electrode fingers between the first IDTs and the second IDTs in the other longitudinally coupled resonator filter units, the positions where spurious responses occur are different as described above. As a result, spurious responses are greatly suppressed. In addition, since each of the longitudinally coupled resonator filter units has a structure in which the two IDTs are disposed, a compact edge reflection type longitudinally coupled SAW resonator filter is provided.

In this case, when the plurality of the longitudinally coupled resonator filter units includes a first longitudinally coupled resonator filter unit and a second longitudinally coupled resonator filter unit, the number of the resonator filter units is only two, with the result that a more compact edge reflection type longitudinally coupled SAW resonator filter is obtained.

When each of the longitudinally coupled SAW resonator filters has a first, a second, and a third IDT, and, in at least one of the longitudinally coupled resonator filter units, the ratio of the numbers of pairs of the electrode fingers between the three IDTs is different from the ratio of the numbers of pairs of the electrode fingers between the three IDTs in the remaining longitudinally coupled resonator filter unit, a spurious response occurring in the frequency characteristics of each of the longitudinally coupled resonator filter units is distributed as described above. As a result, a large spurious response is effectively suppressed and minimized, and excellent characteristics are achieved.

Furthermore, since each of the longitudinally coupled resonator filter units has a structure in which three IDTs are disposed, the ratio of the numbers of pairs of the electrode fingers between the IDTs can be different over a wide range, by which the spurious response is even more effectively distributed.

In this case, when the plurality of the longitudinally coupled resonator filter units includes a first, a second, and a third longitudinally coupled resonator filter unit, only the three longitudinally coupled resonator filter units are arranged in a direction which is substantially perpendicular to a surface acoustic wave propagating direction, so that a compact edge reflection type longitudinally coupled SAW resonator filter is produced.

Although certain preferred embodiments of the present invention provide an edge reflection type longitudinally coupled SAW resonator filter, in this case, as a surface acoustic wave, an SH-type surface acoustic wave such as a BGS wave or a Love wave is preferably generated so that a compact SAW resonator filter can be provided.

For the purpose of illustrating the invention, there is shown in the drawings several forms which are presently preferred, it being understood, however, that the present invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

In an edge reflection type longitudinally coupled SAW resonator filter according to preferred embodiments of the present invention, a Shear Horizontal (SH) type surface acoustic wave is used as a suitable surface acoustic wave. Such an SH-type surface acoustic wave is, for example, a Bleustein-Gulyaev-Shimizu (BGS) wave, a Love wave, or a Leaky wave.

Figure 1:
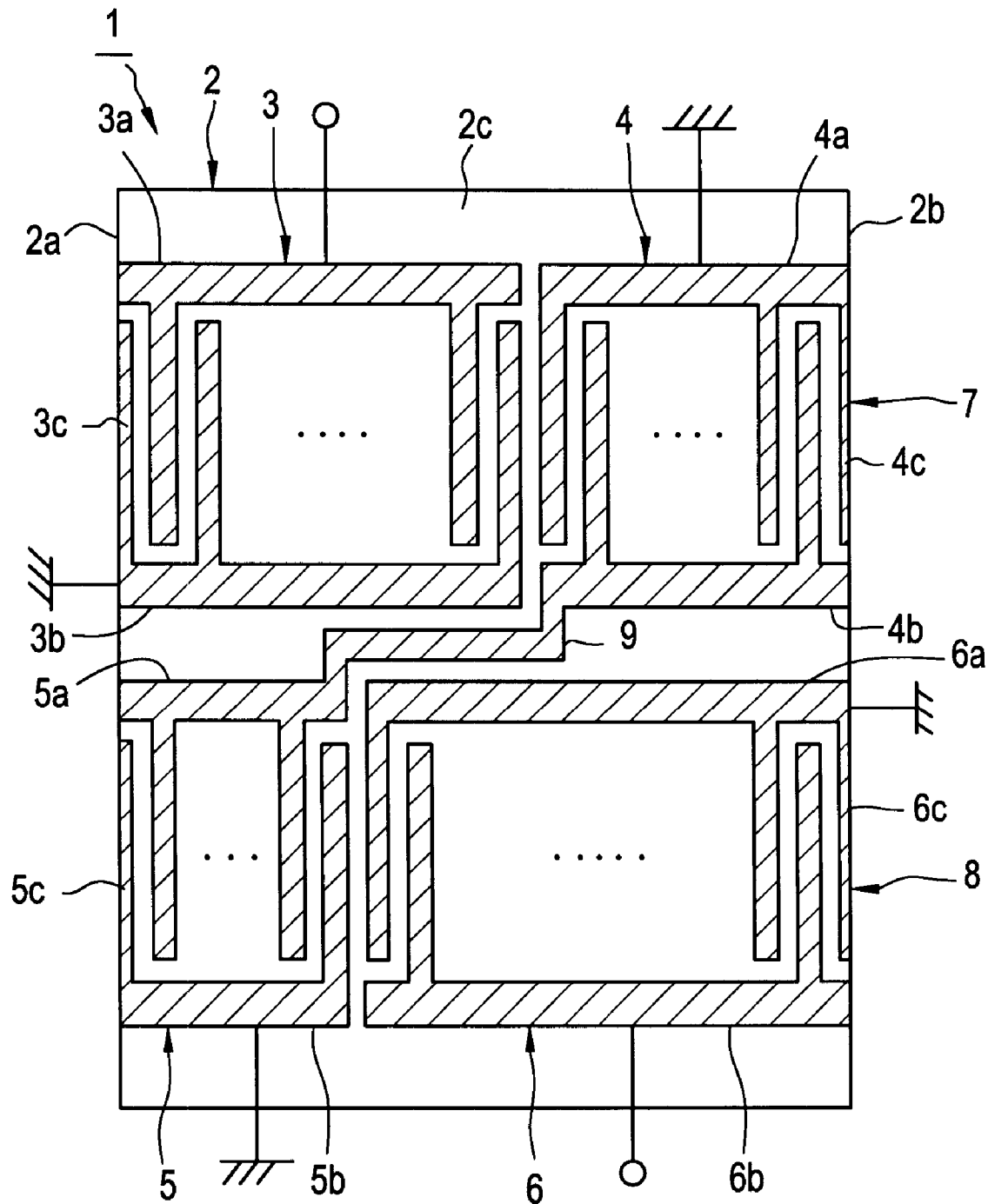
FIG. 1 is a plan view of an edge reflection type longitudinally coupled SAW resonator filter according to a first preferred embodiment of the present invention.

FIG. 1 is a plan view showing an edge reflection type longitudinally coupled SAW resonator filter according to a preferred embodiment of the present invention.

A SAW resonator filter 1 preferably includes a surface acoustic wave substrate 2.

The surface acoustic wave substrate 2 may include a piezoelectric single crystal of quartz, $LiTaO_3$, $LiNbO_3$, $Li_3B_4O_7$, $La_3Ga_5SiO_{14}$, or a piezoelectric ceramic such as lead titanate zirconate. In addition, the surface acoustic wave substrate 2 may also be produced by laminating a piezoelectric film such as a ZnO thin-film on an insulation substrate or a piezoelectric substrate.

When a piezoelectric film is used, IDTs, which will be described below, can be provided either on the upper surface or the lower surface of the piezoelectric film.

The surface acoustic wave substrate 2 has a first end surface 2a and a second end surface 2b, which are arranged at opposite ends of the substrate 2. IDTs 3 to 6 are disposed on the upper surface 2c of the surface acoustic wave substrate 2.

The direction connecting the end surfaces 2a and 2b is a surface acoustic wave propagating direction, in which the IDTs 3 and 4 are aligned. The IDTs 3 and 4 define a first longitudinally coupled resonator filter unit 7.

In addition, the IDTs 5 and 6 are aligned in the surface acoustic wave propagating direction, and the IDTs 5 and 6 define a second longitudinally coupled resonator filter unit 8.

The first and second longitudinally coupled resonator filter units 7 and 8 define a longitudinally coupled SAW resonator filter of an edge reflection type using a Leaky wave as an SH-type surface acoustic wave.

In other words, in the longitudinally coupled resonator filter unit 7, the IDT 3 includes a pair of comb-shaped electrodes 3a and 3b. The comb-shaped electrodes 3a and 3b have a plurality of electrode fingers, which are arranged such that the electrode fingers of 3a and 3b interdigitate with each other. Similarly, the IDT 4 includes a pair of comb-shaped electrodes 4a and 4b arranged to interdigitate with each other.

An outermost electrode finger 3c in the surface acoustic wave propagating direction of the IDT 3 has a width of approximately $\lambda/8$, which is narrower than the widths of the remaining electrode fingers. The widths of the remaining electrode fingers of the IDT 3 are about $\lambda/4$, and the width of a gap between the electrode fingers along the surface acoustic wave propagating direction is also about $\lambda/4$. In the IDT 4, similarly, the width of an outermost electrode finger 4c in the surface acoustic wave propagating direction is about $\lambda/8$, and the widths of the remaining electrode fingers and the width of a gap between the electrodes are about $\lambda/4$.

The second longitudinally coupled resonator filter unit 8 preferably has substantially the same structure as that of the first longitudinally coupled resonator filter unit 7. In other words, the IDT 5 includes comb-shaped electrodes 5a and 5b, and the IDT 6 includes comb-shaped electrodes 6a and 6b. In addition, in the second longitudinally coupled resonator filter unit 8, the widths of electrode fingers 5c and 6c which are the outermost electrode fingers in the surface acoustic wave propagating direction are about $\lambda/8$, and the widths of the remaining electrode fingers and the width of a gap between the electrode fingers are about $\lambda/4$. The comb-shaped electrode 4b of the first longitudinally coupled resonator filter unit 7 is electrically connected to the comb-shaped electrode 5a of the IDT 5 of the second longitudinally coupled resonator filter unit 8 by a connecting conductive portion 9.

When used, an input signal is sent to the comb-shaped electrode 3a of the IDT 3, and then, an output signal is extracted from the comb-shaped electrode 6b of the IDT 6 of the second longitudinally coupled resonator filter unit 8. The comb-shaped electrode 4a of the IDT 4 and the comb-shaped electrode 5b of the IDT 5 are connected to each reference potential.

In the edge reflection type longitudinally coupled SAW resonator filter 1 of this preferred embodiment, the numbers of pairs of the electrode fingers of the first and second longitudinally coupled resonator filter units 7 and 8 are preferably equal. Accordingly, since the positions of the end surfaces 2a and 2b where a surface acoustic wave is reflected are the same in the first and second longitudinally coupled resonator filter units 7 and 8, the end surfaces 2a and 2b can be easily formed by cutting during manufacture of the surface acoustic wave substrate 2.

However, since the ratio of the numbers of pairs of the electrode fingers between the IDTs 3 and 4 in the first longitudinally coupled resonator filter unit 7 is different from the ratio of the numbers of pairs of the electrode fingers between the IDTs 5 and 6 in the second longitudinally coupled resonator filter unit 8, the position of a spurious response occurring in the frequency characteristics of the longitudinally coupled resonator filter unit 7 is different from the position of a spurious response occurring in the frequency characteristics of the second longitudinally coupled resonator filter unit 8.

Accordingly, since the positions of the out-of-band spurious responses generated by the longitudinally coupled resonator filter units 7 and 8 are different, it is possible to effectively suppress the out-of-band spurious response in the frequency characteristics of the SAW resonator filter 1. As a result of this structure, excellent filter characteristics are achieved. This will be illustrated based on a detailed empirical example.

As a specific example of a SAW resonator filter according to a preferred embodiment of the present invention, the edge reflection type longitudinally coupled SAW resonator filter 1 in which the numbers of pairs of electrode fingers of the IDTs 3–6 are different is prepared. In this example, the IDTs 3–6 have 17.5, 16.5, 13.5 and 20.5 pairs of electrode fingers, respectively.

Figure 2:
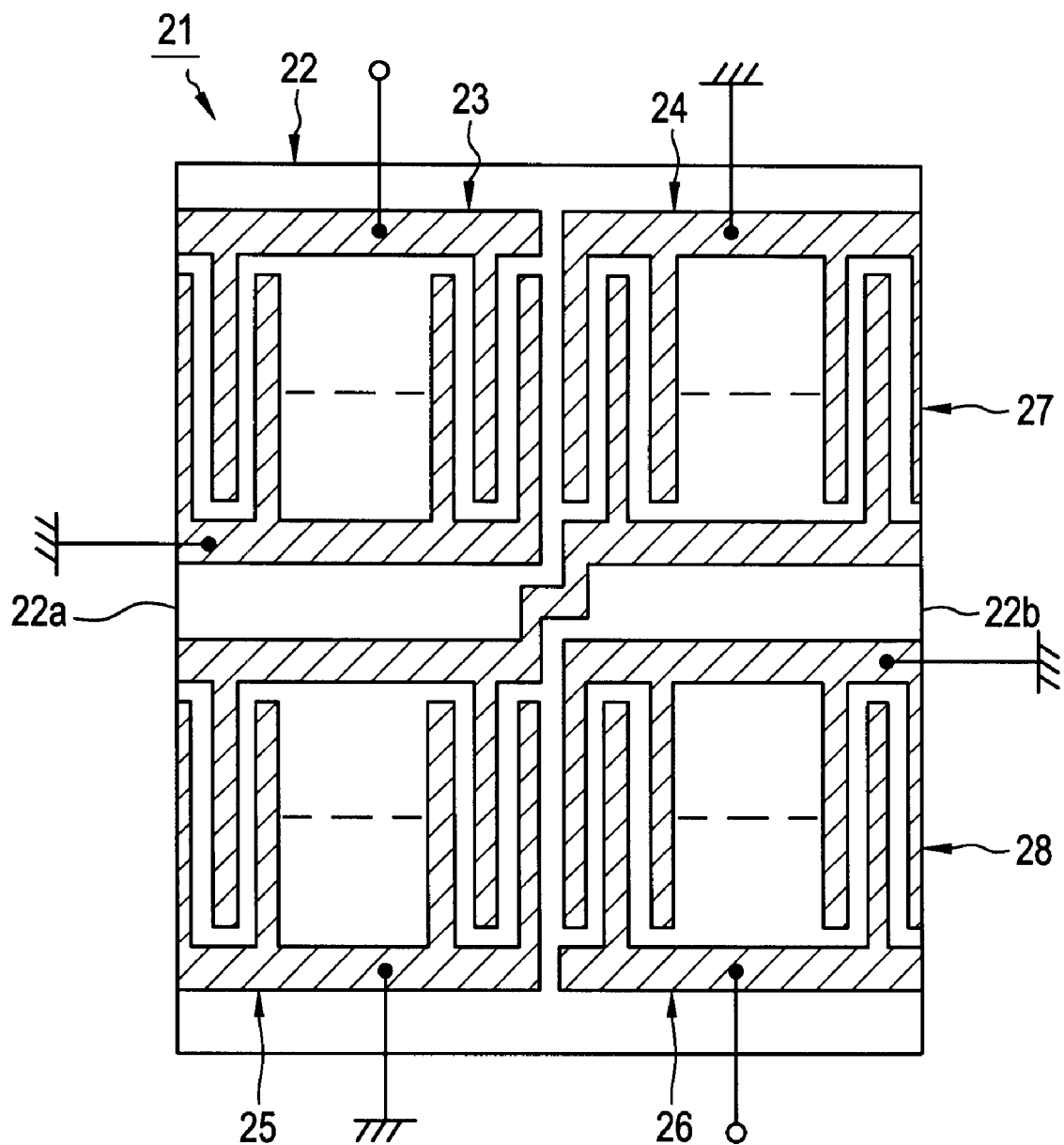
FIG. 2 is a plan view of an edge reflection type longitudinally coupled SAW resonator filter prepared for comparison to the preferred embodiment shown in FIG. 1.

For comparison, an edge reflection type longitudinally coupled SAW resonator filter shown in FIG. 2 is prepared. In an edge reflection type longitudinally coupled SAW resonator filter 21, IDTs 23 to 26 are disposed on a rectangular surface acoustic wave substrate 22. The IDTs 23 and 24 define a first longitudinally coupled resonator filter unit 27, and the IDTs 25 and 26 define a second longitudinally coupled resonator filter unit 28.

In the edge reflection type longitudinally coupled SAW resonator filter 21, similarly, the numbers of pairs of the electrode fingers of the first and second longitudinally coupled resonator filter units 27 and 28 are equal. Accordingly, end surfaces 22a and 22b can be easily formed by cutting a surface acoustic wave substrate 22.

In the IDTs 23 to 26, the numbers of pairs of the electrode fingers are the same. The other elements of this example of a preferred embodiment are arranged in the same way as in the case of the edge reflection type longitudinally coupled SAW resonator filter 1 used in the preferred embodiment described above.

Figure 3:
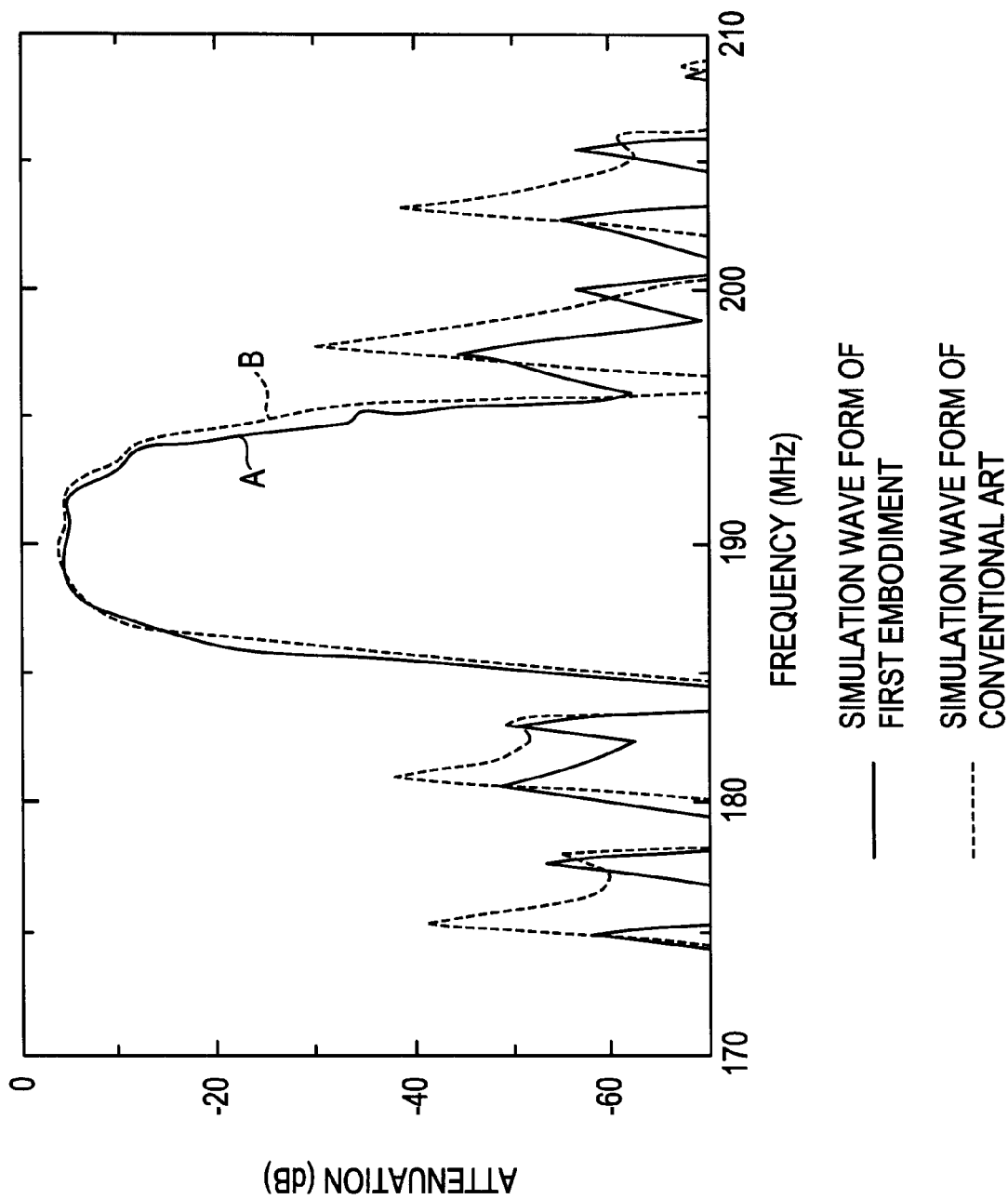
FIG. 3 is a graph illustrating the attenuation-frequency characteristics of the edge reflection type longitudinally coupled SAW resonator filters used in the preferred embodiment of FIG. 1 and the example prepared for comparison shown in FIG. 2.

FIG. 3 shows attenuation-frequency characteristics of the edge reflection type longitudinally coupled SAW resonator filter 1 of the present preferred embodiment and the edge reflection type longitudinally coupled SAW resonator filter 21 prepared for comparison. The surface acoustic wave substrates 2 and 22 are made of $LiTaO_3$, and the size of each of the substrates is 1.4 mm×2.0 mm×0.35 mm. In addition, the number of pairs of the electrode fingers of each resonator filter unit is 34.

A solid line A shown in FIG. 3 indicates the characteristics of the SAW resonator filter 1 of this preferred embodiment, and a dotted line B shown in FIG. 3 indicates the attenuation-frequency characteristics of the edge reflection type longitudinally coupled SAW resonator filter 21 prepared for comparison.

As is evident from the comparison shown by the solid line A and the dotted line B, according to this preferred embodiment, a spurious response occurring out of the band is effectively suppressed, thereby providing greatly improved filter characteristics. This occurs because the ratio of the numbers of pairs of the electrode fingers between the IDTs 3 and 4 is different from the ratio of the numbers of pairs of the electrode fingers between the IDTs 5 and 6, by which the positions where the spurious responses occur are different between the longitudinally coupled resonator filter units 7 and 8.

Figure 4:
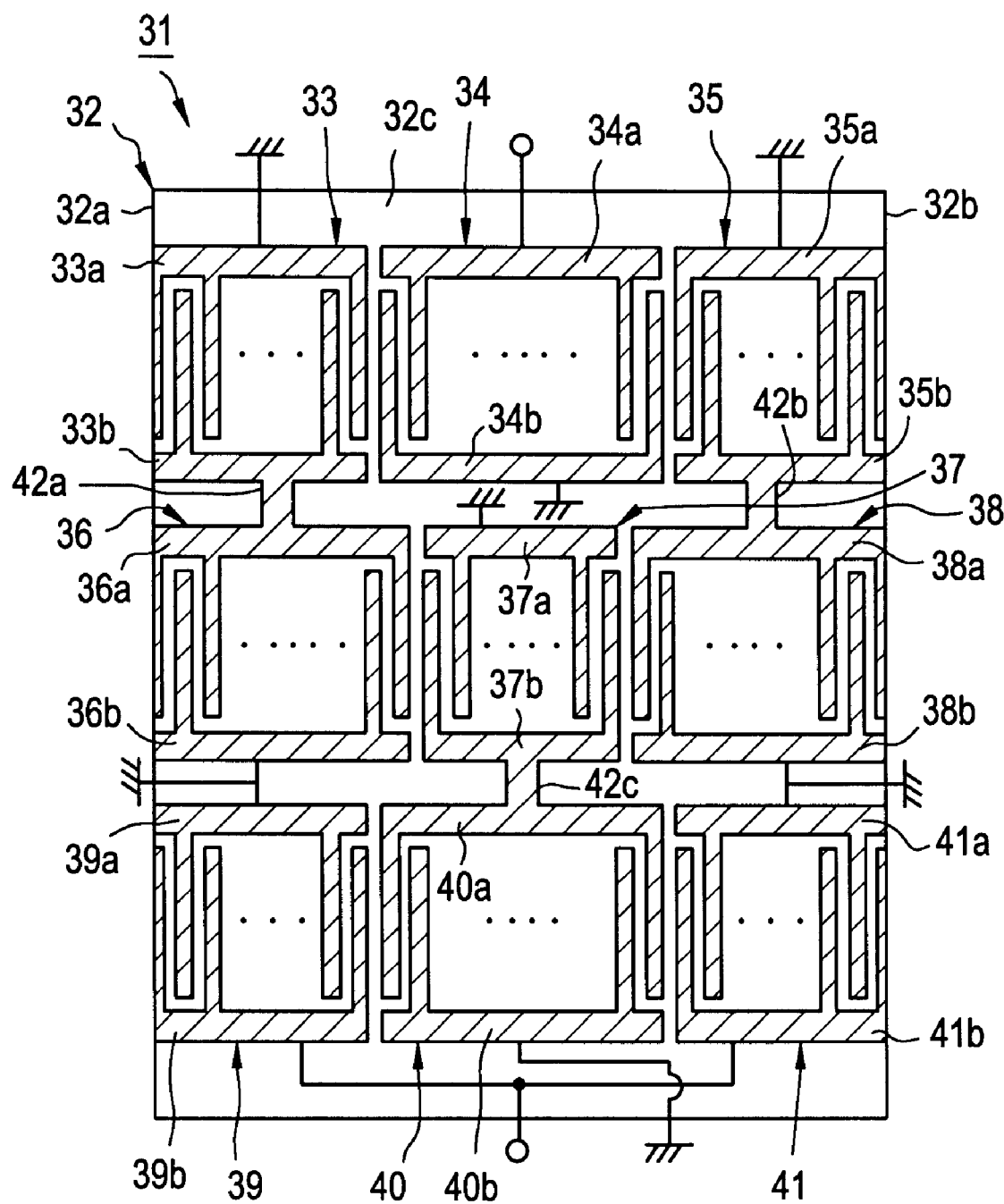
FIG. 4 is a plan view of an edge reflection type longitudinally coupled SAW resonator filter according to a preferred embodiment of the present invention.

FIG. 4 is a plan view of the edge reflection type longitudinally coupled SAW resonator filter according to another preferred embodiment of the present invention.

A SAW resonator filter 31 including a surface acoustic wave substrate 32.

Three longitudinally coupled resonator filter units each having three IDTs aligned in a surface acoustic wave propagating direction are disposed on an upper surface 32c of the surface acoustic wave substrate 32.

In other words, the first longitudinally coupled resonator filter unit has a first IDT 33, a second IDT 34, and a third IDT 35. In addition, the second longitudinally coupled resonator filter unit has a first IDT 36, a second IDT 37, and a third IDT 38 aligned in the surface acoustic wave propagating direction.

Furthermore, the third longitudinally coupled resonator filter unit has a first IDT 39, a second IDT 40, and a third IDT 41 aligned in the surface acoustic wave propagating direction.

Each of the first to third longitudinally coupled resonator filter units preferably is an edge reflection type longitudinally coupled resonator filter unit using an SH-type surface acoustic wave. The direction connecting the mutually opposing first end surface 32*a* and second end surface 32*b* of the surface acoustic wave substrate 32 is the surface acoustic wave propagating direction to provide a structure in which a surface acoustic wave is reflected between the end surfaces 32*a* and 32*b*.

The numbers of pairs of the electrode fingers in the first to third longitudinally coupled resonator filter units are preferably all the same. As a result, as in the case of the edge reflection type longitudinally coupled SAW resonator filter 1 used in the preferred embodiment described above, the edge reflection type longitudinally coupled SAW resonator filter 31 can be easily produced by using the surface acoustic wave substrate 32. In other words, after forming the IDTs 33 to 41 on the large surface acoustic wave substrate, the end surfaces 32*a* and 32*b* can be easily formed by cutting.

In this preferred embodiment, in the first longitudinally coupled resonator filter unit and the third longitudinally coupled resonator filter unit, the ratios of the numbers of pairs of the electrode fingers between the first to third IDTs are preferably equal. However, the ratios of the numbers of pairs of the electrode fingers between the first to third IDTs in the first and third longitudinally coupled resonator filter units are different from the ratio of the numbers of pairs of the electrode fingers between the IDTS in the second longitudinally coupled resonator filter unit.

More specifically, the ratio of the numbers of pairs of the electrode fingers between the IDTs 33 to 35 in the first longitudinally coupled resonator filter unit is 27:35:27. Similarly, the ratio of the numbers of pairs of the electrode fingers between the first to third IDTs 39 to 41 in the third longitudinally coupled resonator filter unit is 27:35:27.

The ratio of the numbers of pairs of the electrode fingers between the first to third IDTs 36 to 38 in the second longitudinally coupled resonator filter unit is 33:23:33.

Therefore, as in the case of the preferred embodiment described above, in the frequency characteristics of the overall edge reflection type longitudinally coupled SAW resonator filter 31, the positions of spurious responses occurring in the frequency characteristics of the first and third longitudinally coupled resonator filter units are different from the position of a spurious response occurring in the frequency characteristics of the second longitudinally coupled resonator filter unit. As a result, since the spurious responses are distributed in the frequency characteristics of the edge reflection type longitudinally coupled SAW resonator filter 31, the magnitude of the spurious responses is greatly reduced such that excellent characteristics are achieved.

In the SAW resonator filter 31, in order to electrically connect the first and second longitudinally coupled resonator filter units, the comb-shaped electrode 33*b* of the IDT 33 is electrically connected to the comb-shaped electrode 36*a* of the IDT 36 by a connecting conductive portion 42*a*. Similarly, the comb-shaped electrode 35*b* of the IDT 35 is electrically connected to the comb-shaped electrode 38*a* of the IDT 38 by a connecting conductive portion 42*b*. In addition, the comb-shaped electrode 37*b* of the IDT 37 is electrically connected to the comb-shaped electrode 40*a* of the IDT 40 by a connecting conductive portion 42*c*.

When driven, an input signal is transmitted to the comb-shaped electrode 34*a* of the IDT 34, and an output signal is extracted from the comb-shaped electrodes 39*b* and 41*b* of the IDTs 39 and 41. The other comb-shaped electrodes 33*a*, 34*b*, 35*a*, 36*b*, 37*a*, 38*b*, 39*a*, 40*b*, and 41*a* are connected to reference potentials.

The present invention can be suitably applied to various electronic components or devices including a surface acoustic wave filter in which the unique features of various preferred embodiments of the present invention are successfully used. For example, preferred embodiments of the present invention may be applied to a duplexer and communications apparatus including the duplexer.

Figure 5:
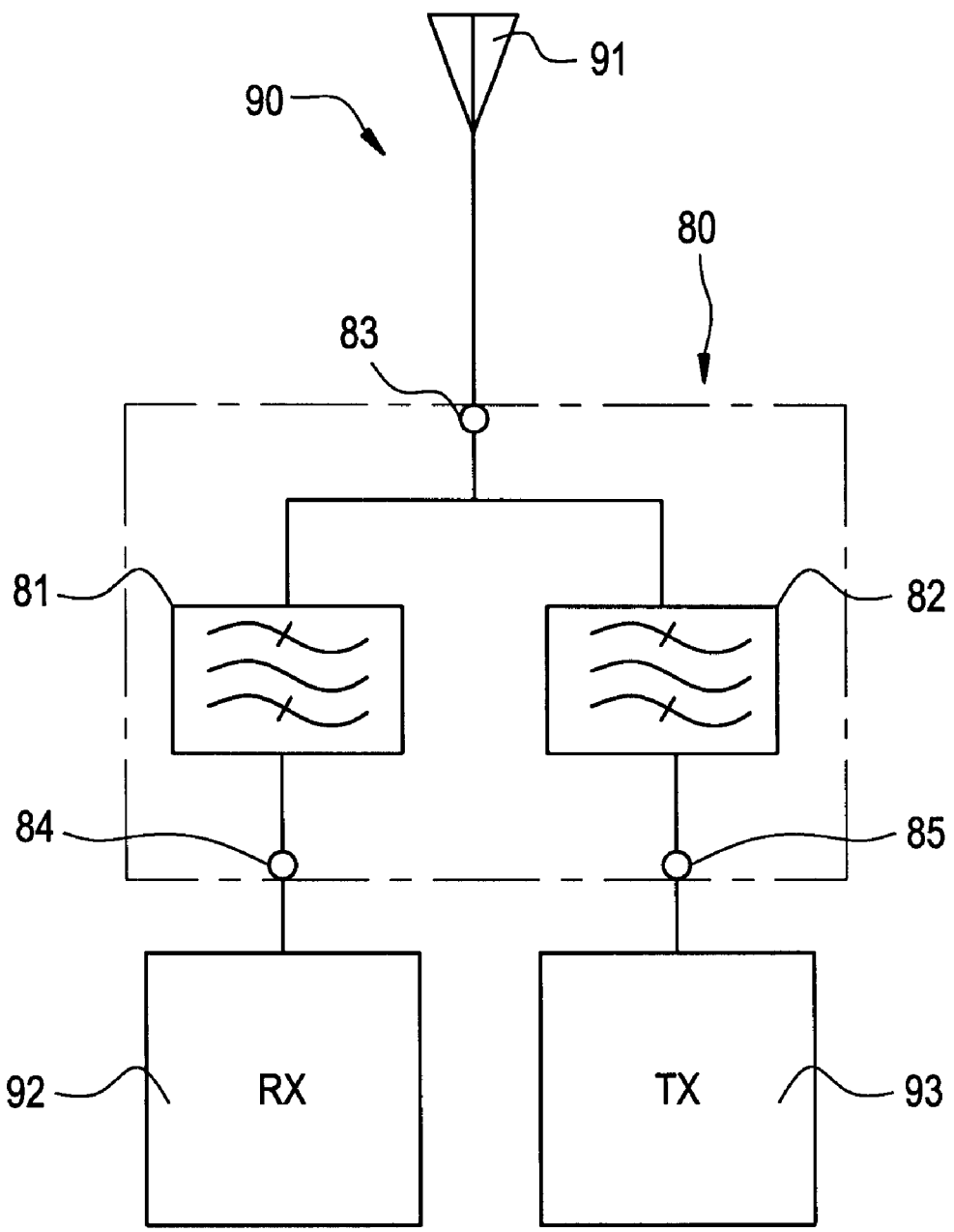
FIG. 5 is a block diagram of a communication apparatus according to a preferred embodiment of the present invention.
Figure 6:
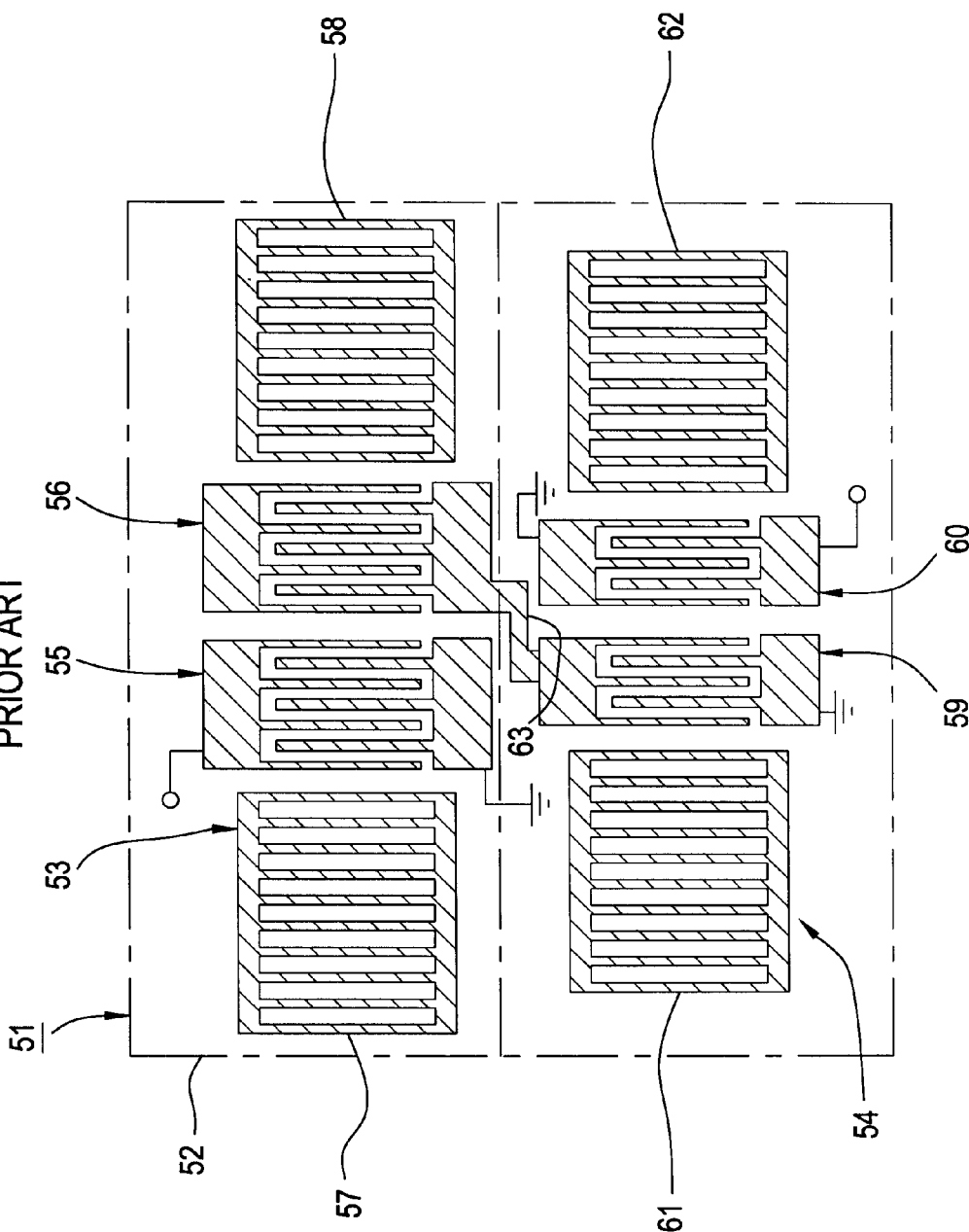
FIG. 6 is a plan view of a conventional longitudinally coupled SAW resonator filter using a Rayleigh wave.

FIG. 5 is a block diagram of a communications apparatus 90 having a duplexer 80. The communication apparatus 90 may be a cellular phone, for example, as a cellular phone which usually requires a small handy body and a high frequency selectivity due to a narrow communication band can greatly benefit from the aforementioned advantages achieved by the filter according to preferred embodiments of the present invention.

The communication apparatus 90 preferably includes a duplexer 80, an antenna 91, a receiver 92 and a transmitter 93. The duplexer 80 includes a SAW filter 81 and a SAW filter 82, and one ends of the SAW filter 81 and the SAW filter 82 are connected in parallel to define a first terminal 83. The other ends of the SAW filter 81 and the SAW filter 82 are connected to a second terminal 84 and a third terminal 85. The SAW filter 81 and the SAW filter 82 may be any one of the saw filters explained in the aforementioned examples. The antenna 91, the receiver 92 and the transmitter 93 are connected to the first terminal 83, the second terminal 84 and the third terminal 85 of the duplexer 80.

The pass bands of the SAW filters 81 and 82 of the duplexer 80 are selected such that the signals received through the antenna 91 passes through the SAW filter 81 and are blocked by the SAW filter 82 and that the signals to be transmitted from the transmitter 93 passes through the SAW filter 82.

As will be understood form the aforementioned explanations, the number of the longitudinally coupled resonator filter units in the edge reflection type longitudinally coupled SAW resonator filter in accordance with the present invention is not restricted to the number included in preferred embodiments of the present invention shown in the figures. In other words, four or more longitudinally coupled resonator filter units can be included on the same surface acoustic wave substrate.

Furthermore, the number of IDTs in the longitudinally coupled resonator filter units is also not restricted to the number included in preferred embodiments of the present invention shown in the figures. Four or more IDTs can be used.

In other words, when a plurality of longitudinally coupled resonator filter units is provided, and each of the longitudinally coupled resonator filter units has a plurality of IDTs, according to preferred embodiments of the present invention, in at least one of the longitudinally coupled resonator filter units, as long as the ratio of the numbers of pairs of the electrode fingers between the plurality of the IDTs is different from the ratios of the numbers of pairs of the electrode fingers between the plurality of the IDTs in the remaining longitudinally coupled resonator filter units, spurious responses are minimized, with the result that excellent characteristics are achieved.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An edge reflection type longitudinally coupled SAW resonator filter comprising:
    a surface acoustic wave substrate having a first end surface and a second end surface disposed at opposite ends of the substrate;
    a plurality of edge reflection longitudinally coupled resonator filter units arranged on the substrate such that a surface acoustic wave is reflected between the first end surface and the second end surface of the surface acoustic wave substrate; and
    a connecting conductive portion arranged to electrically connect the plurality of the longitudinally coupled resonator filter units;
    wherein each of the longitudinally coupled resonator filter units has a plurality of interdigital transducers aligned in a surface acoustic wave propagating direction, the numbers of pairs of electrode fingers in the plurality of the longitudinally coupled resonator filter units being equal; and
    a ratio of the numbers of pairs of the electrode fingers between the plurality of the interdigital transducers in at least one of the plurality of the longitudinally coupled resonator filter units is different from ratios of the numbers of pairs of the electrode fingers between the plurality of the interdigital transducers in the other longitudinally coupled resonator filter units.

2. An edge reflection type longitudinally coupled SAW resonator filter according to claim 1, wherein each of the longitudinally coupled resonator filter units has a first interdigital transducer and a second interdigital transducer, and the ratio of the numbers of pairs of the electrode fingers between the first and second interdigital transducers in at least one of the longitudinally coupled resonator filter units is different from the ratio of the numbers of pairs of the electrode fingers between the first and second interdigital transducers in the other longitudinally coupled resonator filter unit.

3. An edge reflection type longitudinally coupled SAW resonator filter according to claim 2, wherein the plurality of the longitudinally coupled resonator filter units includes a first longitudinally coupled resonator filter unit and a second longitudinally coupled resonator filter unit.

4. An edge reflection type longitudinally coupled SAW resonator filter according to claim 1, wherein each of the plurality of the longitudinally coupled resonator filter units has a first interdigital transducer, a second interdigital transducer, and a third interdigital transducer, and the ratio of the numbers of pairs of the electrode fingers among the three interdigital transducers in at least one of the longitudinally coupled resonator filter units is different from the ratios of the numbers of pairs of the electrode fingers among the three interdigital transducers in the remaining longitudinally coupled resonator filter units.

5. An edge reflection type longitudinally coupled SAW resonator filter according to claim 4, wherein the plurality of the longitudinally coupled resonator filter units includes a first longitudinally coupled resonator filter unit, a second longitudinally coupled resonator filter unit, and a third longitudinally coupled resonator filter unit, and the ratios of the numbers of pairs of the electrode fingers among the three interdigital transducers in the first and third longitudinally coupled resonator filter units are different from the ratio of the numbers of pairs of the electrode fingers among the three interdigital transducers in the second longitudinally coupled resonator filter unit.

6. An edge reflection type longitudinally coupled SAW resonator filter according to claim 1, wherein the surface acoustic wave is an SH-type surface acoustic wave.

7. An edge reflection type longitudinally coupled SAW resonator filter according to claim 1, wherein the surface acoustic wave is one of a Bleustein-Gulyaev-Shimizu wave, a Love wave, and a Leaky wave.

8. An edge reflection type longitudinally coupled SAW resonator filter according to claim 1, wherein in at least one of the plurality of the longitudinally coupled resonator filter units, the widths of the electrode fingers which are the outermost electrode fingers in the surface acoustic wave propagating direction are about $\lambda/8$, and the widths of the remaining electrode fingers and the width of a gap between the electrode fingers are about $\lambda/4$.

9. An edge reflection type longitudinally coupled SAW resonator filter according to claim 1, wherein the surface acoustic wave substrate is made of one of a piezoelectric ceramic material and a piezoelectric single crystal including one of quartz, $LiTaO_3$, $LiNbO_3$, $Li_3B_4O_7$, and $La_3Ga_5SiO_{14}$.

10. An edge reflection type longitudinally coupled SAW resonator filter according to claim 1, wherein the surface acoustic wave substrate includes a substrate having a piezoelectric film disposed thereon.

11. A duplexer comprising:
    at least one edge reflection type longitudinally coupled SAW resonator filter including:
        a surface acoustic wave substrate having a first end surface and a second end surface disposed at opposite ends of the substrate;
        a plurality of edge reflection longitudinally coupled resonator filter units arranged on the substrate such that a surface acoustic wave is reflected between the first end surface and the second end surface of the surface acoustic wave substrate; and
        a connecting conductive portion arranged to electrically connect the plurality of the longitudinally coupled resonator filter units;
        wherein each of the longitudinally coupled resonator filter units has a plurality of interdigital transducers aligned in a surface acoustic wave propagating direction, the numbers of pairs of electrode fingers in the plurality of the longitudinally coupled resonator filter units being equal; and
        a ratio of the numbers of pairs of the electrode fingers between the plurality of the interdigital transducers in at least one of the plurality of the longitudinally coupled resonator filter units is different from ratios of the numbers of pairs of the electrode fingers between the plurality of the interdigital transducers in the other longitudinally coupled resonator filter units.

12. A duplexer according to claim 11, wherein each of the longitudinally coupled resonator filter units has a first interdigital transducer and a second interdigital transducer, and the ratio of the numbers of pairs of the electrode fingers between the first and second interdigital transducers in at least one of the longitudinally coupled resonator filter units is different from the ratio of the numbers of pairs of the electrode fingers between the first and second interdigital transducers in the other longitudinally coupled resonator filter unit.

13. A duplexer according to claim 12, wherein the plurality of the longitudinally coupled resonator filter units includes a first longitudinally coupled resonator filter unit and a second longitudinally coupled resonator filter unit.

14. A duplexer according to claim 11, wherein each of the plurality of the longitudinally coupled resonator filter units has a first interdigital transducer, a second interdigital transducer, and a third interdigital transducer, and the ratio of the numbers of pairs of the electrode fingers among the three interdigital transducers in at least one of the longitudinally coupled resonator filter units is different from the ratios of the numbers of pairs of the electrode fingers among the three interdigital transducers in the remaining longitudinally coupled resonator filter units.

15. A duplexer according to claim 14, wherein the plurality of the longitudinally coupled resonator filter units includes a first longitudinally coupled resonator filter unit, a second longitudinally coupled resonator filter unit, and a third longitudinally coupled resonator filter unit, and the ratios of the numbers of pairs of the electrode fingers among the three interdigital transducers in the first and third longitudinally coupled resonator filter units are different from the ratio of the numbers of pairs of the electrode fingers among the three interdigital transducers in the second longitudinally coupled resonator filter unit.

16. A duplexer according to claim 11, wherein the surface acoustic wave is an SH-type surface acoustic wave.

17. A duplexer according to claim 11, wherein the surface acoustic wave is one of a Bleustein-Gulyaev-Shimizu wave, a Love wave, and a Leaky wave.

18. A duplexer according to claim 11, wherein in at least one of the plurality of the longitudinally coupled resonator filter units, the widths of the electrode fingers which are the outermost electrode fingers in the surface acoustic wave propagating direction are about $\lambda/8$, and the widths of the remaining electrode fingers and the width of a gap between the electrode fingers are about $\lambda/4$.

19. A duplexer according to claim 11, wherein the surface acoustic wave substrate is made of one of a piezoelectric ceramic material and a piezoelectric single crystal including one of quartz, $LiTaO_3$, $LiNbO_3$ $Li_3B_4O_7$, and $La_3Ga_5SiO_4$.

20. A duplexer according to claim 11, wherein the surface acoustic wave substrate includes a substrate having a piezoelectric film disposed thereon.

21. A communications apparatus comprising a duplexer according to claim 11, a receiver connected to the duplexer, a transmitter connected to the duplexer and an antenna connected to the duplexer.

\* \* \* \* \*